(12) United States Patent
Murata et al.

(10) Patent No.: US 12,176,809 B2
(45) Date of Patent: Dec. 24, 2024

(54) POWER FEEDING CONTROL APPARATUS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Hayaki Murata, Yokkaichi (JP); Shunichi Sawano, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 243 days.

(21) Appl. No.: 17/923,425

(22) PCT Filed: Apr. 26, 2021

(86) PCT No.: PCT/JP2021/016562
§ 371 (c)(1),
(2) Date: Nov. 4, 2022

(87) PCT Pub. No.: WO2021/230051
PCT Pub. Date: Nov. 18, 2021

(65) Prior Publication Data
US 2023/0198387 A1   Jun. 22, 2023

(30) Foreign Application Priority Data
May 13, 2020  (JP) .................................. 2020-084667

(51) Int. Cl.
| | | |
|---|---|---|
| H02M 3/155 | (2006.01) | |
| H02M 1/32 | (2007.01) | |
| B60R 16/02 | (2006.01) | |

(52) U.S. Cl.
CPC ............. *H02M 3/155* (2013.01); *H02M 1/32* (2013.01); *B60R 16/02* (2013.01)

(58) Field of Classification Search
CPC ................................ H02M 3/155; H02M 1/32
See application file for complete search history.

(56) References Cited

U.S. PATENT DOCUMENTS

2006/0187604 A1   8/2006  Ohshima
2018/0034458 A1   2/2018  Tsukamoto et al.
(Continued)

FOREIGN PATENT DOCUMENTS

| JP | 2016-76750 A | 5/2016 |
| JP | 2018-157621 A | 10/2018 |
| WO | 2015-114788 A1 | 8/2015 |

OTHER PUBLICATIONS

International Search Report, Application No. PCT/JP2021/016562, mailed Jul. 6, 2021. ISA/Japan Patent Office.

*Primary Examiner* — Jue Zhang
*Assistant Examiner* — Lakaisha Jackson
(74) *Attorney, Agent, or Firm* — Honigman LLP

(57) ABSTRACT

A drain and a source of an N-channel type FET included in a power feeding control apparatus are provided on an electric current path along which an electric current flows from a DC power supply to a load, the drain being a part of the FET into which the electric current is input and the source being a part of the FET from which the electric current is output. A driving circuit switches the FET off when a first determination circuit determines that a control voltage between a gate and the source of the FET is greater than or equal to a first threshold value, and a second determination circuit determines that a drain-source voltage between the drain and the source of the FET is greater than or equal to a second threshold value.

10 Claims, 7 Drawing Sheets

(56) References Cited

U.S. PATENT DOCUMENTS

2019/0204889 A1* 7/2019 Kaeriyama ............. H02M 1/32
2021/0175884 A1* 6/2021 Kondo .................... H02M 1/08
2023/0163676 A1* 5/2023 Abesingha .......... H02M 1/0009
　　　　　　　　　　　　　　　　　　　　　　323/271

* cited by examiner

When Vgs ≥ Vth1 is satisfied: Low-level voltage

When Vgs < Vth1 is satisfied: High-level voltage

Vr1 = A·Vth1

When Vds ≥ Vth2 is satisfied: Low-level voltage

When Vds < Vth2 is satisfied: High-level voltage

Vr2＝B・Vth2

POWER FEEDING CONTROL APPARATUS

CROSS-REFERENCE TO RELATED APPLICATIONS

This application is the U.S. national stage of PCT/JP2021/016562 filed on Apr. 26, 2021, which claims priority of Japanese Patent Application No. JP 2020-084667 filed on May 13, 2020, the contents of which are incorporated herein.

TECHNICAL FIELD

The present disclosure relates to a power feeding control apparatus.

BACKGROUND

JP 2006-229864 A discloses a power feeding control apparatus for a vehicle that controls power feeding from a DC power supply to a load. In the power feeding control apparatus, the drain and the source of an N-channel type FET (Field Effect Transistor) that functions as a semiconductor switch are provided on an electric current path along which an electric current flows from the DC power supply to the load. On the electric current path, the drain is located upstream of the source. The power feeding from the DC power supply to the load is controlled by switching the FET on or off.

The voltage between the drain and the source of the FET when the FET is on can be expressed by a product of the resistance value between the drain and the source of the FET and the electric current that flows via the FET. When the FET is on, and the voltage between the drain and the source of the FET is greater than or equal to a predetermined voltage, a large electric current flows via the FET, and thus the FET is switched off. This prevents an overcurrent from flowing via the FET.

When switching the FET from off to on, the voltage of the gate of the FET relative to the ground potential is increased. By doing so, in the FET, the voltage between the gate and the source increases, and the resistance value between the drain and the source decreases to a sufficiently small value. As a result, the FET is switched on. During the transition period in which the FET is switched from off to on, the resistance value between the drain and the source of the FET is large. Accordingly, during the transition period, the voltage between the drain and the source of the FET may be greater than or equal to a predetermined voltage despite the fact that the electric current that flows via the FET is small. In order to prevent an erroneous operation of switching the FET off despite the fact that the electric current that flows via the FET is small, the FET is not switched back off to allow the voltage between the gate and the source to continue to increase during the transition period in which the FET is switched from off to on.

An electric current flows via the FET during the transition period in which the FET is switched from off to on. In the power feeding control apparatus disclosed in JP 2006-229864A, for example, when the FET is switched from off to on in a state in which the load is short-circuited at both ends, an overcurrent continues to flow during the transition period. As a result, the temperature of the FET rises to an abnormal temperature, which may cause the FET to breakdown.

Accordingly, it is an object of the present disclosure to provide a power feeding control apparatus, wherein an FET is switched back off during a transition period in which the FET is switched from off to on when a large electric current flows via the FET.

SUMMARY

A power feeding control apparatus according to an aspect of the present disclosure includes: an N-channel type FET that is provided in an electric current path along which an electric current flows from a DC power supply to a load such that a drain of the FET is located upstream of a source of the FET; a first determination circuit that determines whether or not a control voltage between a gate and the source of the FET is greater than or equal to a first threshold value; a second determination circuit that determines whether or not a drain-source voltage between the drain and the source of the FET is greater than or equal to a second threshold value; and a switching circuit that switches the FET to off when the first determination circuit determines that the control voltage is greater than or equal to the first threshold value, and the second determination circuit determines that the drain-source voltage is greater than or equal to the second threshold value.

Advantageous Effects of the Present Disclosure

According to the present disclosure, the FET is switched back off during the transition period in which the FET is switched from off to on when a large electric current flows via the FET.

DETAILED DESCRIPTION OF PREFERRED EMBODIMENTS

Figure 1:
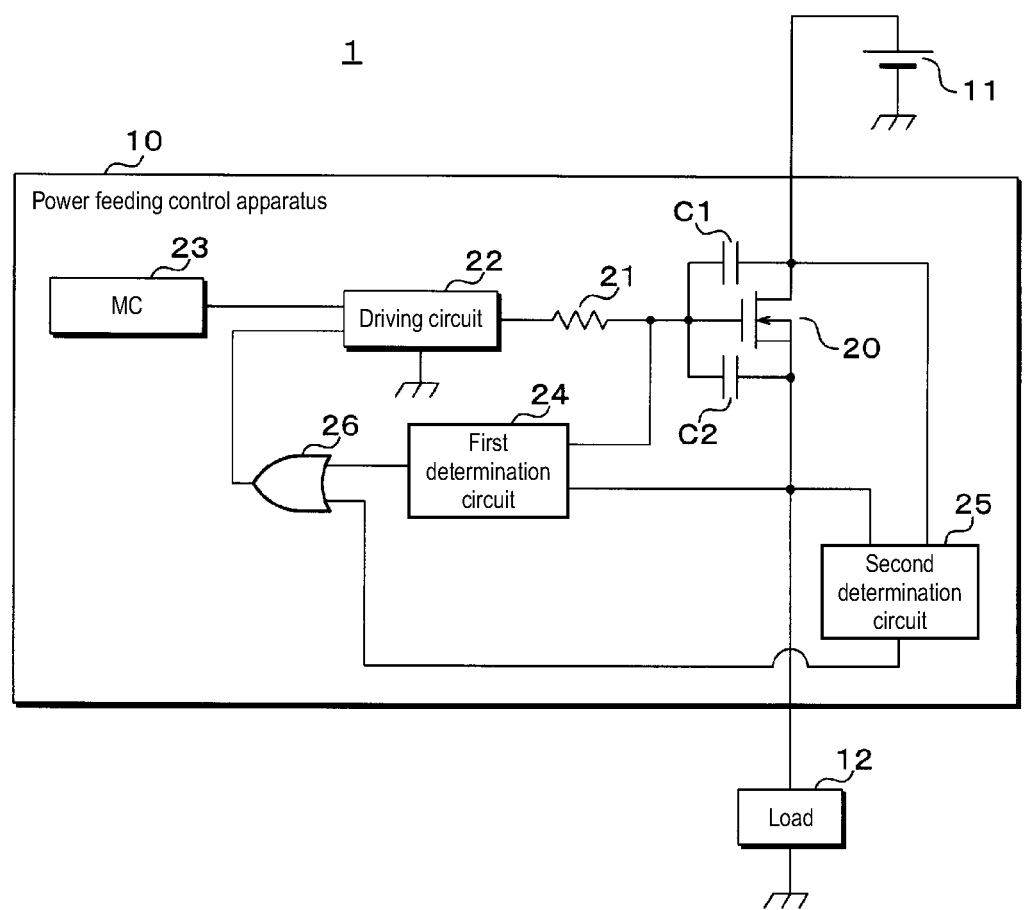
FIG. 1 is a block diagram showing a configuration of an essential part of a power supply system according to Embodiment 1.

First, aspects of an embodiment according to the present disclosure will be listed and described. At least a portion of the aspects of the embodiment described below may be combined as appropriate.

First Aspect

A power feeding control apparatus according to a first aspect of the present disclosure includes: an N-channel type FET that is provided in an electric current path along which an electric current flows from a DC power supply to a load such that a drain of the FET is located upstream of a source of the FET; a first determination circuit that determines whether or not a control voltage between a gate and the source of the FET is greater than or equal to a first threshold value; a second determination circuit that determines whether or not a drain-source voltage between the drain and the source of the FET is greater than or equal to a second threshold value; and a switching circuit that switches the FET to off when the first determination circuit determines that the control voltage is greater than or equal to the first threshold value, and the second determination circuit determines that the drain-source voltage is greater than or equal to the second threshold value.

In the first aspect, the voltage between the gate and the source of the FET is a control voltage. The voltage between the drain and the source of the FET is a drain-source voltage. When switching the FET from off to on, the control voltage is increased. If no breakdown has occurred, the resistance value between the drain and the source of the FET decreases when the control voltage is increased, and thus the drain-source voltage decreases.

The first threshold value and the second threshold value are set to satisfy the following condition. If no breakdown has occurred, the control voltage is smaller than the first threshold value, and the drain-source voltage is greater than or equal to the second threshold value while the FET is off. When the control voltage is increased, the drain-source voltage decreases to a voltage smaller than the second threshold value while the control voltage is smaller than the first threshold value. When the first threshold value and the second threshold value are set to satisfy this condition, as long as no breakdown occurs, a state in which the control voltage is greater than or equal to the first threshold value and the drain-source voltage is greater than or equal to the second threshold value does not occur.

When a large electric current flows via the FET during the transition period in which the FET is switched from off to on, a state in which the control voltage is greater than or equal to the first threshold value and the drain-source voltage is greater than or equal to the second threshold value is achieved, and the FET is switched back off.

Second Aspect

In the power feeding control apparatus according to a second aspect of the present disclosure, when the control voltage is increased, the first threshold value is greater than the control voltage at a time at which the electric current starts flowing via the drain and the source of the FET, and the second threshold value is greater than or equal to 0 V and less than a voltage of the DC power supply.

In the second aspect, the control voltage between the gate and the source of the FET is increased by increasing the voltage of the gate whose reference potential is, for example, ground potential. It is assumed that no breakdown has occurred. In this case, the control voltage is kept at a voltage at the time at which the electric current starts flowing during a period from when the electric current starts flowing via the drain and the source of the FET to when the drain-source voltage decreases from the voltage of the DC power supply to a voltage close to 0 V. The first threshold value is greater than the control value at the time at which the electric current starts flowing via the drain and the source of the FET, and thus, if no breakdown has occurred, the drain-source voltage reliably decreases to a voltage smaller than the second threshold value while the control voltage is smaller than the first threshold value.

Third Aspect

In the power feeding control apparatus according to a third aspect of the present disclosure, the first determination circuit includes: an amplifier that amplifies the control voltage; and a comparison device that compares the control voltage amplified by the amplifier with a predetermined voltage, and the predetermined voltage is set to a product of the first threshold value and an amplification factor of the amplifier.

In the third aspect, a voltage that is proportional to the control voltage is generated using the amplifier, and the generated voltage is compared with the predetermined voltage. With this configuration, a comparison between the control voltage and the first threshold value is achieved.

Fourth Aspect

In the power feeding control apparatus according to a fourth aspect of the present disclosure, the second determination circuit includes: a first resistor that is provided in a second electric current path along which an electric current flows and whose upstream side end is connected to the drain of the FET; an adjustment device that adjusts a voltage of a downstream side end of the first resistor to a voltage of the source of the FET; a second resistor that is located downstream of the first resistor in the second electric current path; and a second comparison device that compares an across voltage of the second resistor with a second predetermined voltage, and the second predetermined voltage is set to a value obtained by dividing a product of the second threshold value and a resistance value of the second resistor by a resistance value of the first resistor.

In the fourth aspect, the voltage of the downstream side end of the first resistor is adjusted to the voltage of the source of the FET, and thus the across voltage of the second resistor is proportional to the drain-source voltage between the drain and the source of the FET. The across voltage of the second resistor is compared with the second predetermined voltage. With this configuration, a comparison between the drain-source voltage and the second threshold value is achieved.

Fifth Aspect

In the power feeding control apparatus according to a fifth aspect of the present disclosure, the second determination circuit includes: a second amplifier that amplifies the drain-source voltage; and a third comparison device that compares the drain-source voltage amplified by the second amplifier with a third predetermined voltage, and the third predetermined voltage is set to a product of the second threshold value and an amplification factor of the second amplifier.

In the fifth aspect, a voltage that is proportional to the drain-source voltage is generated using the second amplifier, and the generated voltage is compared with the third predetermined voltage. With this configuration, a comparison between the drain-source voltage and the second threshold value is achieved.

A specific example of a power supply system according to an embodiment of the present disclosure will be described below with reference to the drawings. It is to be noted that the present disclosure is not limited to the examples given below, and the scope of the present disclosure is indicated by the appended claims, and all changes that come within the meaning and range of equivalency of the claims are intended to be embraced within the scope of the present disclosure.

Embodiment 1

Configuration of Power Supply System

FIG. 1 is a block diagram showing a configuration of an essential part of a power supply system 1 according to Embodiment 1. The power supply system 1 is preferably mounted in a vehicle, and includes a power feeding control apparatus 10, a DC power supply 11, and a load 12. The power feeding control apparatus 10 includes an N-channel type FET 20 that functions as a semiconductor switch. A first capacitor C1 is connected between the drain and the gate of the FET 20. A second capacitor C2 is connected between the source and the gate of the FET 20. The first capacitor C1 and the second capacitor C2 are parasitic capacitances of the FET 20. The DC power supply 11 is, for example, a battery. The load 12 is an electric device mounted in the vehicle.

When the FET 20 is on, the resistance value between the drain and the source of the FET 20 is sufficiently small, and thus an electric current can flow via the drain and the source of the FET 20. When the FET 20 is off, the resistance value between the drain and the source of the FET 20 is sufficiently large, and thus no electric current flows via the FET 20.

The drain and the source of the FET 20 are connected to the positive electrode of the DC power supply 11 and one end of the load 12, respectively. The negative electrode of the DC power supply 11 and the other end of the load 12 are grounded. In the power feeding control apparatus 10, power feeding from the DC power supply 11 to the load 12 is controlled by switching the FET 20 on or off.

When the FET 20 is on, an electric current flows from the positive electrode of the DC power supply 11 to the load 12 via the FET 20. As a result, electric power is supplied from the DC power supply 11 to the load 12, and the load 12 starts operating. In the case where the electric current flows via the FET 20, the electric current flows through the drain and the source of the FET 20 in this order. Accordingly, the drain and the source of the FET 20 are provided on the electric current path along which the electric current flows from the DC power supply 11 to the load 12, and the drain is located upstream of the source.

When the FET 20 is off, no electric current flows via the FET 20. When the FET 20 is switched from on to off, the supply of electric power to the load 12 is stopped, and the load 12 stops operating.

Configuration of Power Feeding Control Apparatus 10

The power feeding control apparatus 10 includes, in addition to the FET 20, an apparatus resistor 21, a driving circuit 22, a microcomputer (hereinafter referred to as an MC) 23, a first determination circuit 24, a second determination circuit 25, and an OR circuit 26. The driving circuit 22 includes a first input terminal, a second input terminal, an output terminal, and a ground terminal. The OR circuit 26 includes a first input terminal, a second input terminal, and an output terminal.

The gate of the FET 20 is also connected to one end of the apparatus resistor 21. The other end of the apparatus resistor 21 is connected to the output terminal of the driving circuit 22. The first input terminal of the driving circuit 22 is connected to the MC 23. The gate and the source of the FET 20 are connected to the first determination circuit 24 independent of each other. The first determination circuit 24 is also connected to the first input terminal of the OR circuit 26. The drain and the source of the FET 20 are connected to the second determination circuit 25 independent of each other. The second determination circuit 25 is also connected to the second input terminal of the OR circuit 26. The output terminal of the OR circuit 26 is connected to the second input terminal of the driving circuit 22. The ground terminal of the driving circuit 22 is connected to the ground.

The conductivity type of the FET 20 is N-channel, and thus the resistance value between the drain and the source of the FET 20 decreases when the voltage between the gate and the source is increased. Hereinafter, the voltage between the gate and the source of the FET 20 will be referred to as a "control voltage". The FET 20 is off when the control voltage is smaller than an off-voltage. The off-voltage is greater than 0 V. The FET 20 is on when the control voltage is greater than or equal to an on-voltage. The on-voltage is greater than the off-voltage. When the control voltage is greater than or equal to the off-voltage and less than the on-voltage, an electric current can flow via the drain and the source of the FET 20. However, the resistance value between the drain and the source of the FET 20 is large.

The driving circuit 22 switches the FET 20 on or off by adjusting the voltage of the output terminal whose reference potential is the ground potential. When the FET 20 is off, the driving circuit 22 adjusts the voltage of the output terminal to 0 V. Accordingly, the first capacitor C1 is charged by the DC power supply 11, and the across voltage of the first capacitor C1 matches the across voltage of the DC power supply 11. At this time, the voltage of the drain whose reference potential is the ground potential is greater than the voltage of the gate whose reference potential is the ground potential. Also, when the FET 20 is off, the across voltage of the second capacitor C2, or in other words, the control voltage, is 0 V.

The expression "the across voltage of the first capacitor C1 matches the across voltage of the DC power supply 11" does not only refer to the case where the two across voltages match each other in a strict sense. There is no problem as long as they substantially match each other.

Hereinafter, the across voltage of the DC power supply 11 will be referred to as "power supply voltage". The voltage of the gate whose reference potential is the ground potential will be referred to as a "gate voltage". The voltage of the drain whose reference potential is the ground potential will be referred to as a "drain voltage". The voltage of the source whose reference potential is the ground potential will be referred to as a "source voltage".

The driving circuit 22 increases the voltage of the output terminal to a fixed target voltage when switching the FET 20 from off to on. The target voltage is higher than the power supply voltage. The difference between the target voltage and the power supply voltage is greater than or equal to the on-voltage. When the driving circuit 22 increases the voltage of the output terminal, the electric current flows from the output terminal of the driving circuit 22 to the apparatus resistor 21 and the second capacitor C2 in this order, and the second capacitor C2 is charged. As a result, the across voltage of the second capacitor C2, or in other words, the control voltage, increases.

When the second capacitor C2 is charged, the gate voltage also increases. When the gate voltage increases, the across voltage of the first capacitor C1 decreases. When the gate voltage exceeds the power supply voltage, the first capacitor C1 is also charged in addition to the second capacitor C2. At this time, the gate voltage exceeds the drain voltage. When the control voltage reaches a voltage greater than or equal to the on-voltage, the FET 20 is switched on.

The driving circuit 22 decreases the voltage of the output terminal to 0 V when switching the FET 20 off. As a result, the electric current flows from the first capacitor C1 and the second capacitor C2 to the apparatus resistor 21 and the driving circuit 22 in this order, and the first capacitor C1 and the second capacitor C2 are discharged. When the second capacitor C2 is discharged, the across voltage of the second capacitor C2, or in other words, the control voltage, decreases.

When the control voltage reaches a voltage smaller than the off-voltage, the FET 20 is switched off. After the first capacitor C1 has been discharged, the electric current flows from the positive electrode of the DC power supply 11 to the first capacitor C1, the apparatus resistor 21, and the driving circuit 22 in this order, and the DC power supply 11 charges the first capacitor C1. When the across voltage of the first capacitor C1 is equal to the power supply voltage, the charging of the first capacitor C1 is ended.

The driving circuit 22 switches the FET 20 on or off in the manner described above.

Each of the MC 23 and the OR circuit 26 outputs a voltage to the driving circuit 22. The reference potential of the output voltage of each of the MC 23 and the OR circuit 26 is the ground potential. Each of the MC 23 and the OR circuit 26 switches the output voltage to a high-level voltage or a low-level voltage.

In the case where the output voltage of the OR circuit 26 is a high-level voltage, when the MC 23 switches the output voltage from a low-level voltage to a high-level voltage, the driving circuit 22 switches the FET 20 on. When the MC 23 switches the output voltage from a high-level voltage to a low-level voltage, the driving circuit 22 switches the FET 20 off irrespective of the output voltage of the OR circuit 26. When the OR circuit 26 switches the output voltage from a high-level voltage to a low-level voltage, the driving circuit 22 switches the FET 20 off irrespective of the output voltage of the MC 23. After that, the driving circuit 22 keeps FET 20 off.

Each of the first determination circuit 24 and the second determination circuit 25 outputs a voltage to the OR circuit 26. The reference potential of the output voltage of each of the first determination circuit 24 and the second determination circuit 25 is the ground potential. The output voltage of each of the first determination circuit 24 and the second determination circuit 25 may be a high-level voltage or a low-level voltage.

The first determination circuit 24 determines whether or not the voltage between the gate and the source of the FET 20, or in other words, the control voltage, is greater than or equal to a fixed first threshold value. If it is determined that the control voltage is smaller than the first threshold value, the first determination circuit 24 outputs a high-level voltage to the OR circuit 26. If it is determined that the control voltage is greater than or equal to the first threshold value, the first determination circuit 24 outputs a low-level voltage to the OR circuit 26. The second determination circuit 25 determines whether or not the voltage between the drain and the source of the FET 20, or in other words, the drain-source voltage is greater than or equal to a fixed second threshold value. If it is determined that the drain-source voltage is smaller than the second threshold value, the second determination circuit 25 outputs a high-level voltage to the OR circuit 26. If it is determined that the drain-source voltage is greater than or equal to the second threshold value, the second determination circuit 25 outputs a low-level voltage to the OR circuit 26.

When at least one of the output voltage of the first determination circuit 24 and the output voltage of the second determination circuit 25 is a high-level voltage, the OR circuit 26 outputs a high-level voltage. When the output voltage of the first determination circuit 24 and the output voltage of the second determination circuit 25 are both low-level voltages, the OR circuit 26 outputs a low-level voltage.

First Example of Operation of Power Feeding Control Apparatus 10

Figure 2:
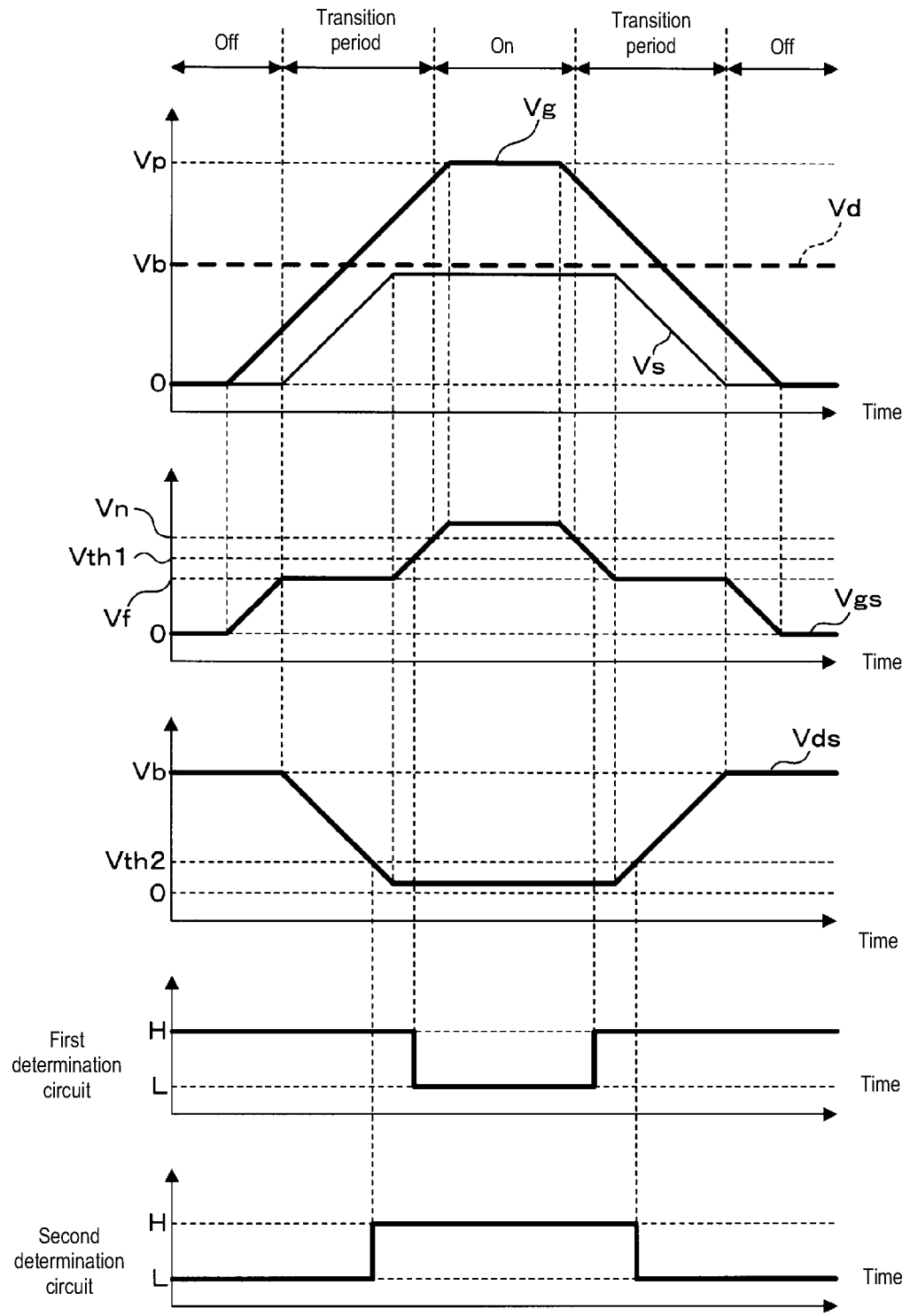
FIG. 2 is a timing chart showing a first example of an operation of a power feeding control apparatus.

FIG. 2 is a timing chart showing a first example of an operation of the power feeding control apparatus 10. FIG. 2 shows an operation of the power feeding control apparatus 10 performed if no breakdown has occurred in the power supply system 1. Vg, Vs, and Vd represent the gate voltage, the source voltage, and the drain voltage, respectively. Vb and Vp represent the power supply voltage and the target voltage of the DC power supply 11, respectively. Vgs and Vds represent the control voltage and the drain-source voltage, respectively. Vn and Vf represent the on-voltage and the off-voltage, respectively. Vth1 and Vth2 represent the first threshold value and the second threshold value, respectively.

In the first section of the timing chart shown in FIG. 2, transitions of the gate voltage Vg, the source voltage Vs, and the drain voltage Vd are indicated by a thick solid line, a thin solid line, and a thick broken line, respectively. The second section shows a transition of the control voltage Vgs. The third section shows a transition of the drain-source voltage Vds. The fourth section shows a transition of the output voltage of the first determination circuit 24. The fifth section shows a transition of the output voltage of the second determination circuit 25. In each of the sections showing the transitions, the horizontal axis represents time.

The drain of the FET 20 is connected directly to the positive electrode of the DC power supply 11, and thus the drain voltage Vd is fixed at the power supply voltage Vb. As noted above, the driving circuit 22 keeps the FET 20 off by keeping the output voltage at 0 V. When the output voltage of the driving circuit 22 is 0 V, the second capacitor C2 is discharged. When the discharging of the second capacitor C2 has finished, the control voltage Vgs is 0 V, and the gate voltage Vg and the source voltage Vs match each other.

When the control voltage is 0 V, the FET 20 is off, and thus no electric current flows via the load 12. Accordingly, the gate voltage Vg and the source voltage Vs are 0 V. The drain voltage Vd is fixed at the power supply voltage Vb, and thus the drain-source voltage is kept at the power supply voltage Vb while the source voltage Vs is 0 V.

As noted above, the driving circuit 22 increases the output voltage when switching the FET 20 on. The first capacitor C1 and the second capacitor C2 are thereby charged. The gate voltage Vg increases as the across voltage of the second capacitor C2 increases. The FET 20 is off while the gate voltage Vg is less than the off-voltage Vf, and thus the source voltage Vs is kept at 0 V. Accordingly, when the gate voltage Vg increases, the control voltage Vgs also increases.

When the control voltage Vgs is equal to the off-voltage Vf, the electric current flows via the FET 20 and the load 12. The off-voltage Vf is the control voltage Vgs at the time at which the electric current starts to flow via the drain and the source of the FET 20 when the control voltage Vgs is increased. When the electric current flows via the FET 20 and the load 12, the source voltage Vs increases. The control voltage Vgs thereby reaches a voltage smaller than the off-voltage Vf, and the FET 20 is switched off. When the FET 20 is switched off, the source voltage Vs falls to 0 V, and thus the control voltage Vgs again reaches a voltage greater than or equal to the off-voltage Vf, and the electric current flows via the FET 20. As described above, the operation of causing the electric current to flow via the FET 20 and the operation of switching the FET 20 off are performed alternately. A reduction in the source voltage Vs to 0 V and an increase in the control voltage Vgs are omitted in FIG. 2.

The gate voltage Vg continues to increase while the operation of causing the electric current to flow via the FET 20 and the operation of switching the FET 20 to off are performed alternately, and the control voltage Vgs at the time when the FET 20 is switched off increases with time. The resistance value between the drain and the source of the FET 20 decreases as the control voltage Vgs increases, and a large electric current flows via the FET 20 and the load 12. Accordingly, the source voltage Vs at the time when the FET 20 is switched off increases with time. As a result, the source voltage Vs increases as the gate voltage Vg increases, until the source voltage Vs reaches a voltage close to the power supply voltage Vb. The control voltage Vgs is kept at the off-voltage Vf until the source voltage Vs reaches a voltage close to the power supply voltage Vb. As noted above, the drain voltage Vd is fixed at the power supply voltage Vb, and thus the drain-source voltage Vds of the FET 20 decreases along with the increase of the source voltage Vs.

After the source voltage Vs has reached a voltage close to the power supply voltage Vb, due to the electric current flowing via the FET 20 and the load 12, the control voltage Vgs does not reach a voltage smaller than the off-voltage Vf. Accordingly, the electric current continues to flow via the FET 20 and the load 12. After the source voltage Vs has reached a voltage close to the power supply voltage Vb, the source voltage Vs varies according to the magnitude of the electric current flowing via the FET 20. However, the range of variation is small, and thus the source voltage Vs is kept at a voltage close to the power supply voltage Vb. The drain-source voltage Vds also varies according to the magnitude of the electric current flowing via the FET 20. However, the range of variation is also small, and thus the drain-source voltage Vds is kept at a voltage close to 0 V.

After the source voltage Vs has reached a voltage close to the power supply voltage Vb, the control voltage Vgs also increases as the gate voltage Vg increases. When the control voltage Vgs reaches a voltage greater than or equal to the on-voltage Vn, the FET 20 is switched on. After that, the gate voltage Vg increases to the target voltage Vp. The control voltage Vgs also increases until the gate voltage Vg reaches the target voltage Vp. After the gate voltage Vg has reached the target voltage Vp, the driving circuit 22 keeps the gate voltage Vg at the target voltage Vp. The control voltage Vgs is also kept at the fixed voltage while the gate voltage Vg is equal to the target voltage Vp.

As noted above, the driving circuit 22 decreases the output voltage to 0 V when switching the FET 20 off. The first capacitor C1 and the second capacitor C2 are thereby discharged. The gate voltage Vg decreases as the across voltage of the second capacitor C2 decreases. The control voltage Vgs also decreases as the gate voltage Vg decreases. Even after the control voltage Vgs has reached a voltage smaller than the on-voltage Vn, the electric current continues to flow via the FET 20.

When the control voltage Vgs reaches a voltage smaller than the off-voltage Vf, the FET 20 is switched off. The electric current stops flowing via the load 12, and thus the source voltage Vs decreases to 0 V. As a result, the control voltage Vgs reaches a voltage greater than or equal to the off-voltage Vf, and the electric current starts flowing via the FET 20. The source voltage Vs increases when the electric current flows via the FET 20, and thus the control voltage Vgs again reaches a voltage smaller than the off-voltage Vf, and the electric current stops flowing via the FET 20. As described above, the operation of switching the FET 20 off and the operation of causing the electric current to flow via the FET 20 are performed alternately. A reduction in the source voltage Vs to 0 V and an increase in the control voltage Vgs are omitted in FIG. 2.

The gate voltage Vg continues to decrease while the operation of switching the FET 20 off and the operation of causing the electric current to flow via the FET 20 are performed alternately, and the control voltage Vgs at the time when the FET 20 is switched off decreases with time. The resistance value between the drain and the source of the FET 20 increases as the control voltage Vgs decreases, and a small electric current flows via the FET 20 and the load 12. Accordingly, the source voltage Vs at the time when the electric current flows via the FET 20 decreases with time. As a result, the source voltage Vs decreases as the gate voltage Vg decreases, until the source voltage Vs reaches 0 V. The control voltage Vgs is kept at the off-voltage Vf until the source voltage Vs reaches 0 V. As noted above, the drain voltage Vd is fixed at the power supply voltage Vb, and thus the drain-source voltage Vds of the FET 20 increases as the source voltage Vs decreases.

After the source voltage Vs has reached 0 V, the FET 20 is kept off, and the control voltage Vgs also decreases as the gate voltage Vg decreases. After that, the gate voltage Vg decreases to 0 V. After the source voltage Vs has reached 0 V, because the source voltage Vs is fixed at 0 V, the control voltage Vgs also decreases until the gate voltage Vg reaches 0 V. After the gate voltage Vg has reached 0 V, the driving circuit 22 keeps the gate voltage Vg at 0 V. The control voltage Vgs is also kept at 0 V while the gate voltage Vg is 0 V.

When the source voltage Vs reaches 0 V, the drain-source voltage Vds of the FET 20 is equal to the power supply voltage Vb. After that, the drain-source voltage Vds is kept at the power supply voltage Vb until the control voltage Vgs reaches a voltage greater than or equal to the off-voltage Vf.

The first threshold value Vth1 is greater than the off-voltage Vf. The first threshold value Vth1 is less than or equal to the control voltage Vgs when the gate voltage Vg is equal to the target voltage Vp. FIG. 2 shows an example in which the first threshold value Vth1 is less than the on-voltage Vn. However, the first threshold value Vth1 may be greater than or equal to the on-voltage Vn.

The second threshold value Vth2 is greater than or equal to the drain-source voltage Vds when the gate voltage Vg is equal to the target voltage Vp, and less than the power supply voltage Vb. The drain-source voltage Vds when the gate voltage Vg is equal to the target voltage Vp is greater than or equal to 0 V.

The first threshold value Vth1 and the second threshold value Vth2 are set in the manner described above. Accordingly, if no breakdown has occurred in the power supply system 1, the control voltage Vgs is less than the first threshold value Vth1, and the drain-source voltage Vds is greater than or equal to the second threshold value Vth2 while the FET 20 is off. When switching the FET 20 from off to on, the drain-source voltage Vds reliably decreases from the power supply voltage Vb to a voltage smaller than the second threshold value Vth2 while the control voltage Vgs is less than the first threshold value Vth1. The control voltage Vgs is greater than or equal to the first threshold value Vth1 in a state in which the drain-source voltage Vds is less than the second threshold value Vth2. As a result, during the transition period in which the FET 20 is switched from off to on, a state in which the control voltage Vgs is less than the first threshold value Vth1, and the drain-source voltage Vds is less than the second threshold value Vth2 is not achieved.

Accordingly, when switching the FET 20 from off to on, the second determination circuit 25 switches the output voltage from a low-level voltage to a high-level voltage while the output voltage of the first determination circuit 24 is a high-level voltage. In a state in which the output voltage of the second determination circuit 25 is a high-level voltage, the first determination circuit 24 switches the output voltage from a high-level voltage to a low-level voltage. As a result, a state in which the output voltage of the first determination circuit 24 and the output voltage of the second determination circuit 25 are low-level voltages is not achieved.

Likewise, when switching the FET 20 from on to off, the drain-source voltage Vds increases from a voltage smaller than the second threshold value Vth2 to a voltage greater than or equal to the second threshold value Vth2 after the control voltage Vgs has reached a voltage smaller than the first threshold value Vth1. As a result, during the transition period in which the FET 20 is switched from on to off, a state in which the control voltage Vgs is less than the first threshold value Vth1, and the drain-source voltage Vds is less than the second threshold value Vth2 is not achieved.

Accordingly, when switching the FET 20 from off to on, the second determination circuit 25 switches the output voltage from a high-level voltage to a low-level voltage after the first determination circuit 24 has switched the output voltage from a low-level voltage to a high-level voltage. As a result, a state in which the output voltage of the first determination circuit 24 and the output voltage of the second determination circuit 25 are low-level voltages is not achieved.

As described above, if no breakdown has occurred in the power supply system 1, at least one of the output voltage of the first determination circuit 24 and the output voltage of the second determination circuit 25 is a high-level voltage, and thus the OR circuit 26 continues to output a high-level voltage. When the MC 23 switches the output voltage to a high-level voltage, the driving circuit 22 switches the FET 20 on. The driving circuit 22 switches the FET 20 off when the MC 23 switches the output voltage to a low-level voltage.

Second Example of Operation of Power Feeding Control Apparatus 10

Figure 3:
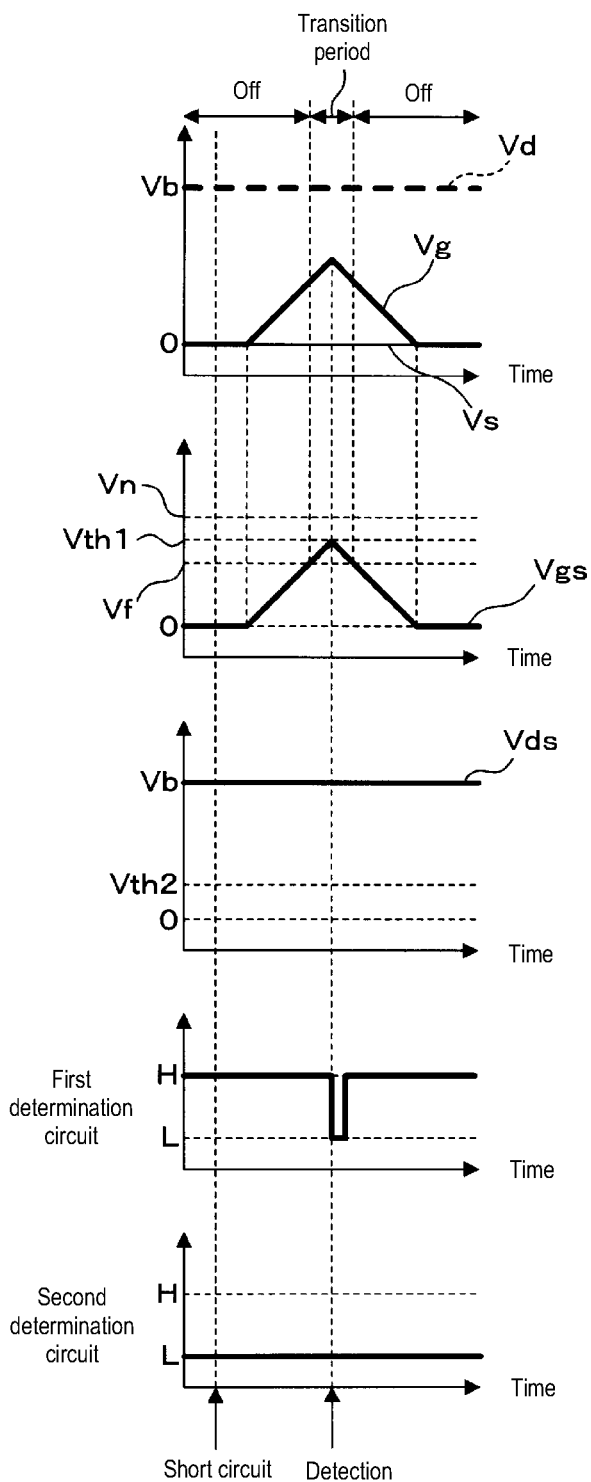
FIG. 3 is a timing chart showing a second example of an operation of a power feeding control apparatus.

FIG. 3 is a timing chart showing a second example of an operation of the power feeding control apparatus 10. FIG. 3 shows an operation of the power feeding control apparatus 10 performed when the load 12 is short-circuited at both ends while the FET 20 is off.

In the timing chart shown in FIG. 3 as well, in the first section, transitions of the gate voltage Vg, the source voltage Vs, and the drain voltage Vd are indicated by a thick solid line, a thin solid line, and a thick broken line. The second section shows a transition of the control voltage Vgs. The third section shows a transition of the drain-source voltage Vds. The fourth section shows a transition of the output voltage of the first determination circuit 24. The fifth section shows a transition of the output voltage of the second determination circuit 25. In each of the sections showing the transitions, the horizontal axis represents time.

As noted above, the drain of the FET 20 is connected directly to the positive electrode of the DC power supply 11, and thus the drain voltage Vd is fixed at the power supply voltage Vb. The driving circuit 22 keeps the FET 20 off by keeping the output voltage at 0 V. Once the discharging of the second capacitor C2 has ended, the gate voltage Vg, the source voltage Vs, and the control voltage Vgs are 0 V. It is assumed that the load 12 is short-circuited at both ends while the FET 20 is off. In this case, a large electric current flows via the FET 20 during the transition period in which the FET 20 is switched from off to on.

The load 12 is short-circuited at both ends, and thus the source voltage Vs is fixed at 0 V. Accordingly, the voltage between the drain and the source of the FET 20, or in other words, the drain-source voltage Vds is fixed at the power supply voltage Vb. As noted above, the second threshold value Vth2 is less than the power supply voltage Vb. Accordingly, the output voltage of the second determination circuit 25 is fixed at a low-level voltage, and will not be switched to a high-level voltage while the load 12 is short-circuited at both ends.

As noted above, the driving circuit 22 increases the output voltage when switching the FET 20 on. The first capacitor C1 and the second capacitor C2 are thereby charged. The gate voltage Vg increases as the across voltage of the second capacitor C2 increases. Because the source voltage Vs is fixed at 0 V, the transition of the control voltage Vgs matches the transition of the gate voltage Vg. When the control voltage Vgs reaches a voltage greater than or equal to the off-voltage Vf, the electric current flows via the FET 20.

The load 12 is short-circuited at both ends, and thus the electric current flowing via the FET 20 increases as the resistance value between the drain and the source of the FET 20 decreases, or in other words, as the control voltage Vgs increases. When the control voltage Vgs reaches a voltage greater than or equal to the first threshold value Vth1, the first determination circuit 24 switches the output voltage from a high-level voltage to a low-level voltage in a state in which the second determination circuit 25 outputs a low-level voltage. Here, the first determination circuit 24 and the second determination circuit 25 detect that the electric current flowing via the FET 20 is large.

When the first determination circuit 24 switches the output voltage from a high-level voltage to a low-level voltage in a state in which the second determination circuit 25 outputs a low-level voltage, the OR circuit 26 switches the output voltage from a high-level voltage to a low-level voltage. When the output voltage of the OR circuit 26 is switched from a high-level voltage to a low-level voltage, as noted above, the driving circuit 22 switches the FET 20 off, and keeps the FET 20 off irrespective of the output voltage of the MC 23. Specifically, the driving circuit 22 decreases the output voltage to 0 V and keeps the output voltage at 0 V. The driving circuit 22 functions as a switching circuit.

Accordingly, when the control voltage Vgs reaches a voltage greater than or equal to the first threshold value Vth1, the driving circuit 22 decreases the output voltage to 0 V and thus the gate voltage Vg and the control voltage Vgs decrease. When the control voltage Vgs reaches a voltage smaller than the first threshold value Vth1, the first determination circuit 24 switches the output voltage from a low-level voltage to a high-level voltage, and the OR circuit 26 switches the output voltage from a low-level voltage to a high-level voltage. However, the driving circuit 22 continuously decreases the output voltage. When the control voltage Vgs reaches a voltage smaller than the off-voltage Vf, the FET 20 is switched off. After that, the gate voltage Vg and the control voltage Vgs decrease to 0 V and are kept at 0 V.

As described above, in the power feeding control apparatus 10, when a large electric current flows via the FET 20 during the transition period in which the FET 20 is switched from off to on, the driving circuit 22 switches the FET 20 back off. This prevents an overcurrent from flowing via the FET 20.

Third Example of Operation of Power Feeding Control Apparatus 10

Figure 4:
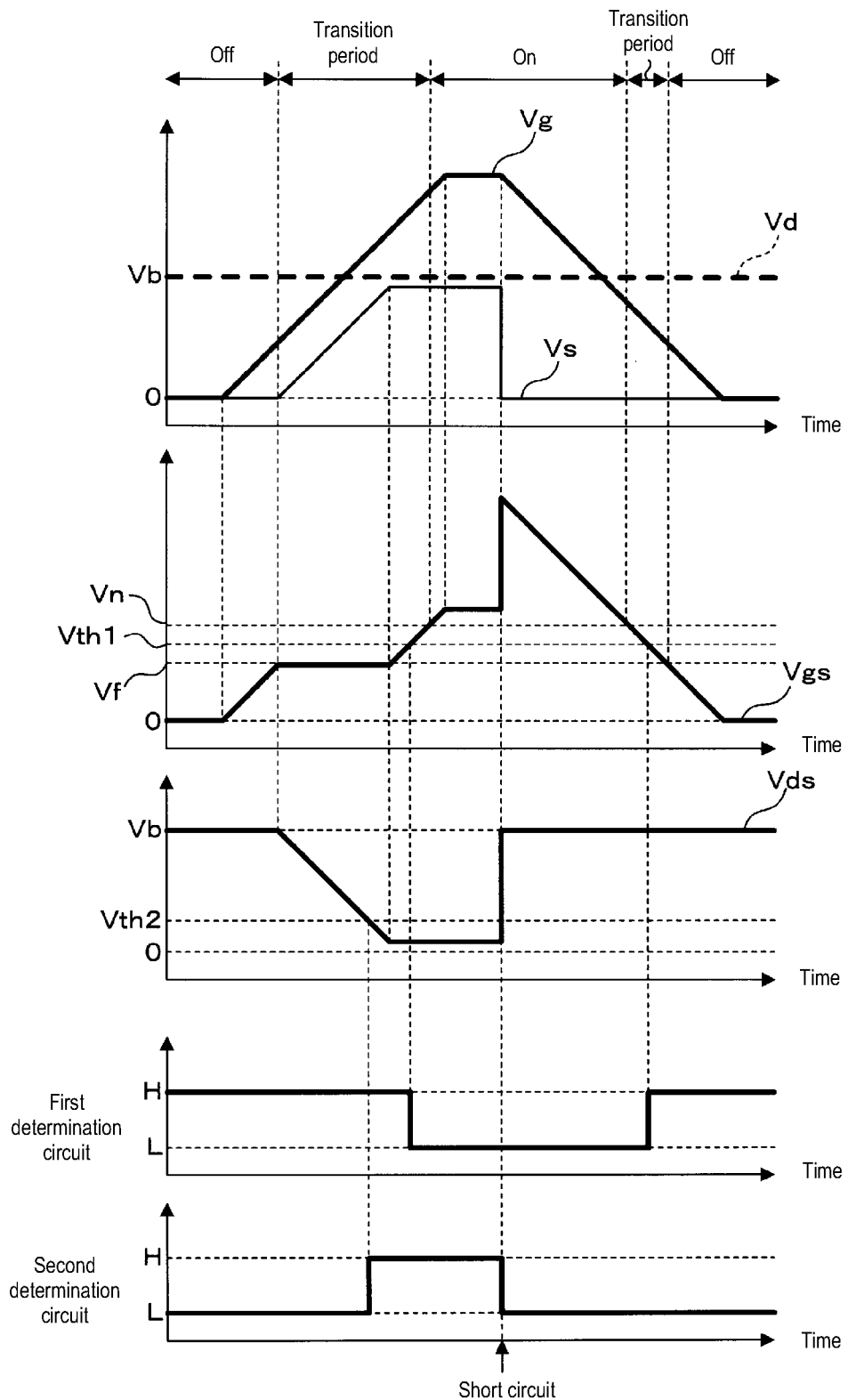
FIG. 4 is a timing chart showing a third example of an operation of a power feeding control apparatus.

FIG. 4 is a timing chart showing a third example of an operation of the power feeding control apparatus 10. FIG. 4 shows an operation of the power feeding control apparatus 10 performed when the load 12 is short-circuited at both ends while the FET 20 is on.

In the timing chart shown in FIG. 4 as well, in the first section, transitions of the gate voltage Vg, the source voltage Vs, and the drain voltage Vd are indicated by a thick solid line, a thin solid line, and a thick broken line. The second section shows a transition of the control voltage Vgs. The third section shows a transition of the drain-source voltage Vds. The fourth section shows a transition of the output voltage of the first determination circuit 24. The fifth section shows a transition of the output voltage of the second determination circuit 25. In each of the sections showing the transitions, the horizontal axis represents time.

When the FET 20 is on, as noted above, the control voltage Vgs is greater than or equal to the first threshold value Vth1, and the drain-source voltage Vds is less than the second threshold value Vth2. It is assumed that the load 12 is short-circuited at both ends while the FET 20 is on, and the electric current flowing via the FET 20 increases. In this case, the source voltage Vs decreases from a voltage close to the power supply voltage Vb to 0 V. As a result, the control voltage Vgs increases, and the drain-source voltage Vds increases to the power supply voltage Vb. As noted above, the second threshold value Vth2 is smaller than the power supply voltage Vb. Accordingly, when the load 12 is short-circuited at both ends, the drain-source voltage Vds reaches a voltage greater than or equal to the second threshold value Vth2 in a state in which the control voltage Vgs is greater than or equal to the first threshold value Vth1.

At this time, the output voltage of the first determination circuit 24 is switched from a high-level voltage to a low-level voltage in a state in which the output voltage of the second determination circuit 25 is a low-level voltage. Here, the first determination circuit 24 and the second determination circuit 25 detect that the electric current flowing via the FET 20 is large. When the output voltage of the first determination circuit 24 is switched from a high-level voltage to a low-level voltage in a state in which the output voltage of the second determination circuit 25 is a low-level voltage, the OR circuit 26 switches the output voltage thereof from a high-level voltage to a low-level voltage. When the output voltage of the OR circuit 26 is switched from a high-level voltage to a low-level voltage, as noted above, the driving circuit 22 decreases the output voltage to 0 V, and keeps the output voltage at 0 V. As a result, the FET 20 is switched off, and the FET 20 is kept off.

After the load 12 has been short-circuited at both ends, because the source voltage Vs is fixed at 0 V, the gate voltage Vg and the control voltage Vgs match each other. When the driving circuit 22 decreases the output voltage to 0 V, the control voltage Vgs decreases. When the control voltage Vgs reaches a voltage smaller than the first threshold value Vth1, the first determination circuit 24 switches the output voltage from a low-level voltage to a high-level voltage, and the OR circuit 26 switches the output voltage from a low-level voltage to a high-level voltage. However, the driving circuit 22 causes the output voltage to keep decreasing. When the control voltage Vgs reaches a voltage smaller than the off-voltage Vf, the FET 20 is switched to off. After that, the gate voltage Vg and the control voltage Vgs decrease to 0 V and are kept at 0 V.

As described above, in the power feeding control apparatus 10, when a large electric current flows via the FET 20 while the FET 20 is on, the driving circuit 22 switches the FET 20 off. This prevents an overcurrent from flowing via the FET 20.

When a large electric current flows via the FET 20 during the transition period in which the FET 20 is switched from on to off, the driving circuit 22 switches the FET 20 off by continuously decreasing the control voltage Vgs.

Configuration of First Determination Circuit 24

Figure 5:
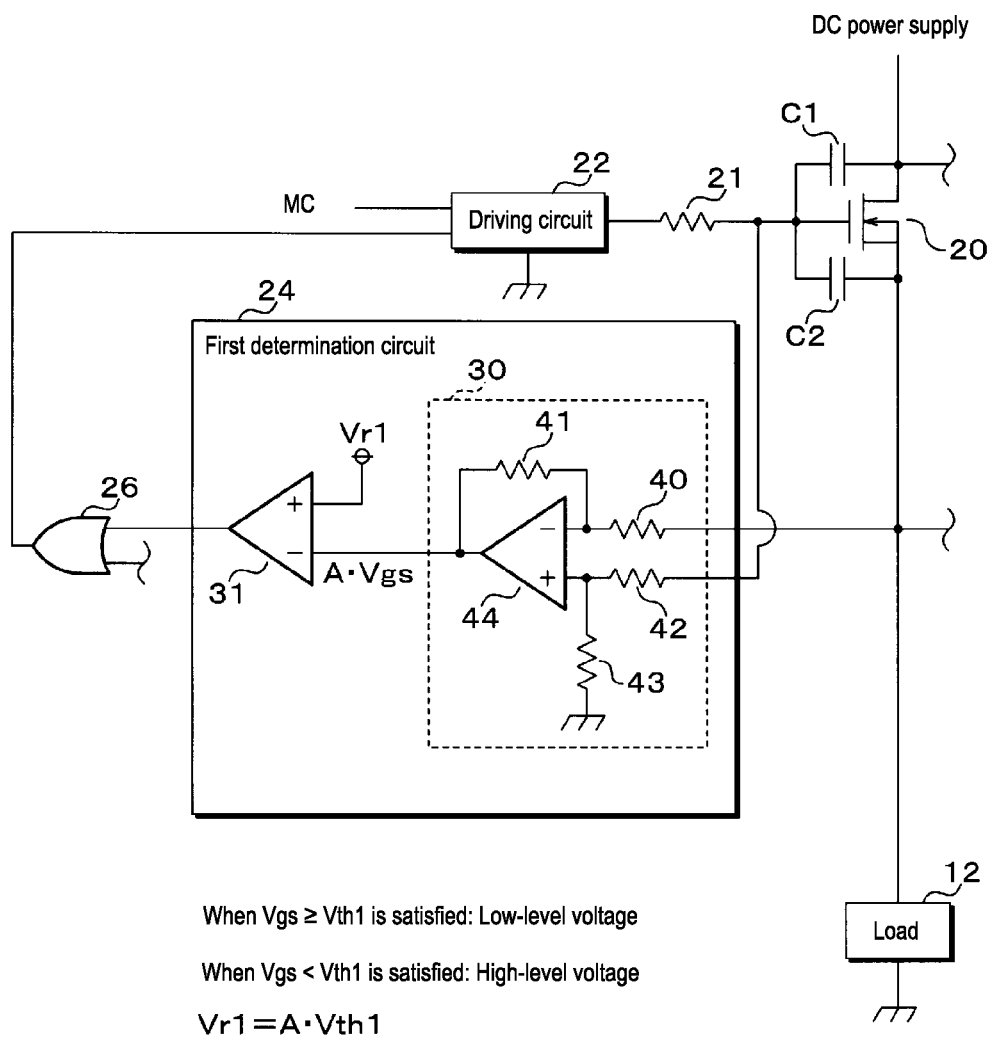
FIG. 5 is a circuit diagram of a first determination circuit.

FIG. 5 is a circuit diagram of the first determination circuit 24. Vr1 represents a fixed first reference voltage whose reference potential is the ground potential. The first determination circuit 24 includes a first differential amplifier 30 and a first comparator 31. The first differential amplifier 30 includes circuit resistors 40, 41, 42, and 43, and a first operational amplifier 44. Each of the first comparator 31 and the first operational amplifier 44 has a positive terminal, a negative terminal, and an output terminal.

The source of the FET 20 is also connected to one end of the circuit resistor 40. The other end of the circuit resistor 40 is connected to one end of the circuit resistor 41 and the negative terminal of the first operational amplifier 44. The other end of the circuit resistor 41 is connected to the output terminal of the first operational amplifier 44. The gate of the FET 20 is also connected to one end of the circuit resistor 42. The other end of the circuit resistor 42 is connected to one end of the circuit resistor 43 and the positive terminal of the first operational amplifier 44. The other end of the circuit resistor 43 is connected to the ground.

The output terminal of the first operational amplifier 44 is connected to the negative terminal of the first comparator 31. The first reference voltage Vr1 is applied to the positive terminal of the first comparator 31. The output terminal of the first comparator 31 is connected to the first input terminal of the OR circuit 26. The first reference voltage Vr1 is generated by, for example, a regulator (not shown) decreasing the power supply voltage Vb of the DC power supply 11

The resistance values of the circuit resistors 40 and 42 match each other. The resistance values of the circuit resistors 41 and 43 match each other. Accordingly, the first operational amplifier 44 amplifies the voltage between the gate and the source of the FET 20, or in other words, the control voltage Vgs. The first operational amplifier 44 applies the amplified voltage to the negative terminal of the first comparator 31. The expressions "the resistance values of the circuit resistors 40 and 42 match each other" and "the resistance values of the circuit resistors 41 and 43 match each other" do not only refer to cases where they match each other in a strict sense. There is no problem as long as they substantially match each other.

In FIG. 5, A indicates the amplification factor of the first differential amplifier 30. The output voltage of the first operational amplifier 44 is expressed by A·Vgs. The symbol "·" indicates multiplication. The amplification factor A is expressed by (resistance value of circuit resistor 41)/(resistance value of circuit resistor 40), and is greater than 0. The resistance values of the circuit resistors 40, 41, 42, and 43 are fixed values, and thus the fixed value of the amplification factor A. The amplification factor A is 1 when the resistance values of the circuit resistors 40, 41, 42, and 43 match each other.

The first comparator 31 outputs a voltage to the OR circuit 26. The output voltage of the first comparator 31 is the output voltage of the first determination circuit 24 described above. The first comparator 31 compares the output voltage of the first operational amplifier 44 with the first reference voltage Vr1. The first comparator 31 functions as a comparison device. The first reference voltage Vr1 corresponds to the predetermined voltage. The first comparator 31 switches the output voltage to a high-level voltage or a low-level voltage according to the result of comparison.

The first comparator 31 switches the output voltage to a low-level voltage when Equation (1) given below is satisfied.

$$A \cdot Vgs \geq Vr1 \tag{1}$$

Equation (2) given below is obtained by expanding Equation (1).

$$Vgs \geq Vr1/A \tag{2}$$

Here, the first reference voltage Vr1 is set to A·Vth1. Accordingly, when Equation (3) given below is satisfied, the first comparator 31 switches the output voltage to a low-level voltage.

$$Vgs \geq Vth1 \tag{3}$$

Likewise, when Equation (4) given below is satisfied, the first comparator 31 switches the output voltage to a high-level voltage.

$$A \cdot Vgs < Vr1 \tag{4}$$

As noted above, Vr1 is set to A·Vth1, and thus when Equation (5) given below is satisfied, the first comparator 31 switches the output voltage to a high-level voltage.

$$Vgs < Vth1 \tag{5}$$

As described above, the first reference voltage Vr1 is set to A·Vth1, and thus a comparison between the control voltage Vgs and the first threshold value Vth1 is achieved. The first comparator 31 outputs a low-level voltage when the control voltage Vgs is greater than or equal to the first threshold value Vth1, and outputs a high-level voltage when the control voltage Vgs is less than the first threshold value Vth1.

Configuration of Second Determination Circuit 25

Figure 6:
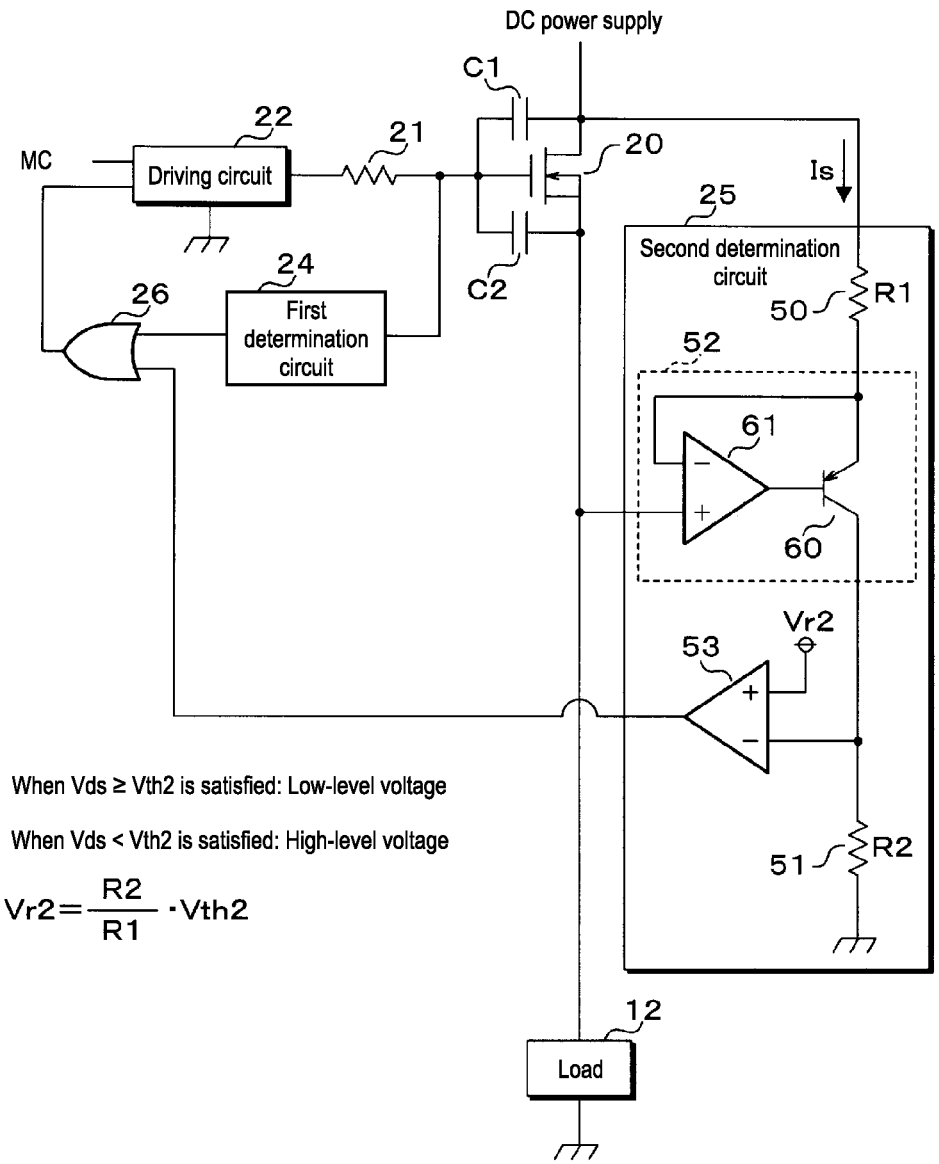
FIG. 6 is a circuit diagram of a second determination circuit.

FIG. 6 is a circuit diagram of the second determination circuit 25. The second determination circuit 25 includes a first resistor 50, a second resistor 51, an adjustment device 52, and a second comparator 53. The adjustment device 52 includes a transistor 60 and a second operational amplifier 61. The transistor 60 is a PNP-type bipolar transistor, and functions as a variable resistor. The second operational amplifier 61 has a positive terminal, a negative terminal, and an output terminal. Vr2 represents a fixed second reference voltage whose reference potential is the ground potential. R1 and R2 represent the resistance value of the first resistor 50 and the resistance value of the second resistor 51, respectively.

One end of the first resistor 50 is connected to the drain of the FET 20. The other end of the first resistor 50 is connected to the emitter of the transistor 60. The collector of the transistor 60 is connected to one end of the second resistor 51. The other end of the second resistor 51 is connected to the ground. The emitter and the base of the transistor 60 are connected to the negative terminal and the output terminal of the second operational amplifier 61, respectively. The positive terminal of the second operational amplifier 61 is connected to the source of the FET 20. The collector of the transistor 60 is also connected to the negative terminal of the second operational amplifier 61. The second reference voltage Vr2 is applied to the positive terminal of the second operational amplifier 61. The output terminal of the second operational amplifier 61 is connected to the second input terminal of the OR circuit 26. The second reference voltage Vr2 is generated by, for example, a regulator (not shown) decreasing the power supply voltage Vb.

Is represents an electric current that flows from the drain of the FET 20 toward the first resistor 50. The electric current Is flows through the first resistor 50, the transistor 60, and the second resistor 51 in this order. The electric current path of the electric current Is corresponds to the second electric current path. Accordingly, the first resistor 50 is provided on the electric current path of the electric current Is, and one end of the first resistor 50 is an upstream side end. The other end of the first resistor 50 is a downstream side end. On the electric current path of the electric current Is, the transistor 60 is located downstream of the first resistor 50, and the second resistor 51 is located downstream of the transistor 60. The electric current Is flows through the emitter and the collector of the transistor 60 in this order.

The resistance value between the emitter and the collector of the transistor 60 varies according to the voltage of the base whose reference potential is the potential of the emitter. The resistance value between the emitter and the collector takes a smaller value as the voltage of the base whose reference potential is the potential of the emitter decreases.

Hereinafter, the voltage of the base whose reference potential is the ground potential will be referred to as a "base voltage". When the base voltage decreases, the voltage of the base whose reference potential is the potential of the emitter decreases. When the base voltage increases, the voltage of the base whose reference potential is the potential of the emitter increases. The second operational amplifier 61 adjusts the resistance value between the emitter and the collector of the transistor 60 by adjusting the base voltage.

Hereinafter, the voltage of the downstream side end of the first resistor 50 will be referred to as a "resistance voltage". The voltage of the source of the FET 20 will be referred to as a "switch voltage". The reference potential of each of the resistance voltage and the switch voltage is the ground potential. The second operational amplifier 61 amplifies a differential voltage obtained by subtracting the resistance voltage from the switch voltage, and applies the amplified voltage to the base of the transistor 60. The output voltage of the second operational amplifier 61 is the base voltage. The second operational amplifier 61 adjusts the base voltage according to the differential voltage.

The second operational amplifier 61 decreases the base voltage when the switch voltage decreases to a voltage smaller than the resistance voltage. By doing so, the resistance value between the emitter and the collector of the transistor 60 decreases. As a result, the electric current Is increases, and the resistance voltage decreases. When the switch voltage increases to a voltage greater than or equal to the resistance voltage, the second operational amplifier 61 increases the base voltage. By doing so, the resistance value between the emitter and the collector of the transistor 60 increases. As a result, the electric current Is decreases, and the resistance voltage increases. The second operational amplifier 61 adjusts the resistance voltage to the switch voltage in the manner described above.

The second operational amplifier 61 adjusts the resistance voltage to the switch voltage, and thus the Equation (6) given below is obtained.

$$Vb - Vds = Vb \cdot R1 \cdot Is \tag{6}$$

Here, as noted above, Vb and Vds represent the power supply voltage of the DC power supply 11 and the drain-source voltage of the FET 20, respectively. Equation (7) is obtained by expanding Equation (6).

$$Is = Vds/R1 \quad (7)$$

There is no problem as long as the transistor 60 functions as a variable resistor. Accordingly, the transistor 60 is not limited to a PNP-type bipolar transistor. The transistor 60 may be, for example, a P-channel type FET. In this case, the drain, the source, and the connector correspond to the collector, the emitter, and the base, respectively.

Equation (8) given below is obtained, where the across voltage of the second resistor 51 is represented by Vs.

$$Vs = R2 \cdot Is \quad (8)$$

Equation (9) given below is obtained by eliminating the electric current Is based on Equations (7) and (8).

$$Vs = R2 \cdot Vds/R1 \quad (9)$$

The second comparator 53 outputs a voltage to the OR circuit 26. The output voltage of the second comparator 53 is the output voltage of the second determination circuit 25 described above. The second comparator 53 compares the across voltage of the second resistor 51 with the second reference voltage Vr2. The second comparator 53 functions as a second comparison device. The second reference voltage Vr2 corresponds to the second predetermined voltage. When the across voltage of the second resistor 51 is greater than or equal to the second reference voltage Vr2, the second comparator 53 switches the output voltage to a low-level voltage. Accordingly, the second comparator 53 switches the output voltage to a low-level voltage when Equation (10) given below is satisfied.

$$R2 \cdot Vds/R1 \geq Vr2 \quad (10)$$

Equation (11) given below is obtained by developing Equation (10).

$$Vds \geq R1 \cdot Vr2/R2 \quad (11)$$

Here, the second reference voltage Vr2 is set to R2·Vth2/R1. Accordingly, the second comparator 53 switches the output voltage to a high-level voltage when Equation (12) given below is satisfied. As noted above, Vth2 represents the second threshold value.

$$Vds \geq Vth2 \quad (12)$$

Likewise, the second comparator 53 switches the output voltage to a high-level voltage when the across voltage of the second resistor 51 is less than the second reference voltage Vr2. Accordingly, the second comparator 53 switches the output voltage to a high-level voltage when Equation (13) given below is satisfied.

$$R2 \cdot Vds/R1 < Vr2 \quad (13)$$

As noted above, Vr2=R2·Vth2/R1 is set, and thus the second comparator 53 switches the output voltage to a high-level voltage when Equation (14) given below is satisfied.

$$Vds < Vth2 \quad (14)$$

As described above, the second reference voltage Vr2 is set to R2·Vth2/R1, and thus a comparison between the drain-source voltage Vds and the second threshold value Vth2 is achieved. The second comparator 53 outputs a low-level voltage when the drain-source voltage Vds is greater than or equal to the second threshold value Vth2, and outputs a high-level voltage when the drain-source voltage Vds is less than the second threshold value Vth2.

Embodiment 2

In Embodiment 1, there is no problem as long as the second determination circuit 25 is a circuit that outputs a voltage that corresponds to the result of comparison between the drain-source voltage Vds of the FET 20 and the second threshold value Vth2. Accordingly, the configuration of the second determination circuit 25 is not limited to the configuration in which the second determination circuit 25 includes a first resistor 50, a second resistor 51, an adjustment device 52, and a second comparator 53.

Hereinafter, Embodiment 2 will be described focusing on differences from Embodiment 1. The structural elements other than those described below are the same as those of Embodiment 1. Accordingly, the structural elements that are the same as those of Embodiment 1 are given the same reference numerals as those given in Embodiment 1, and a description thereof will be omitted.

Configuration of Second Determination Circuit 25

Figure 7:
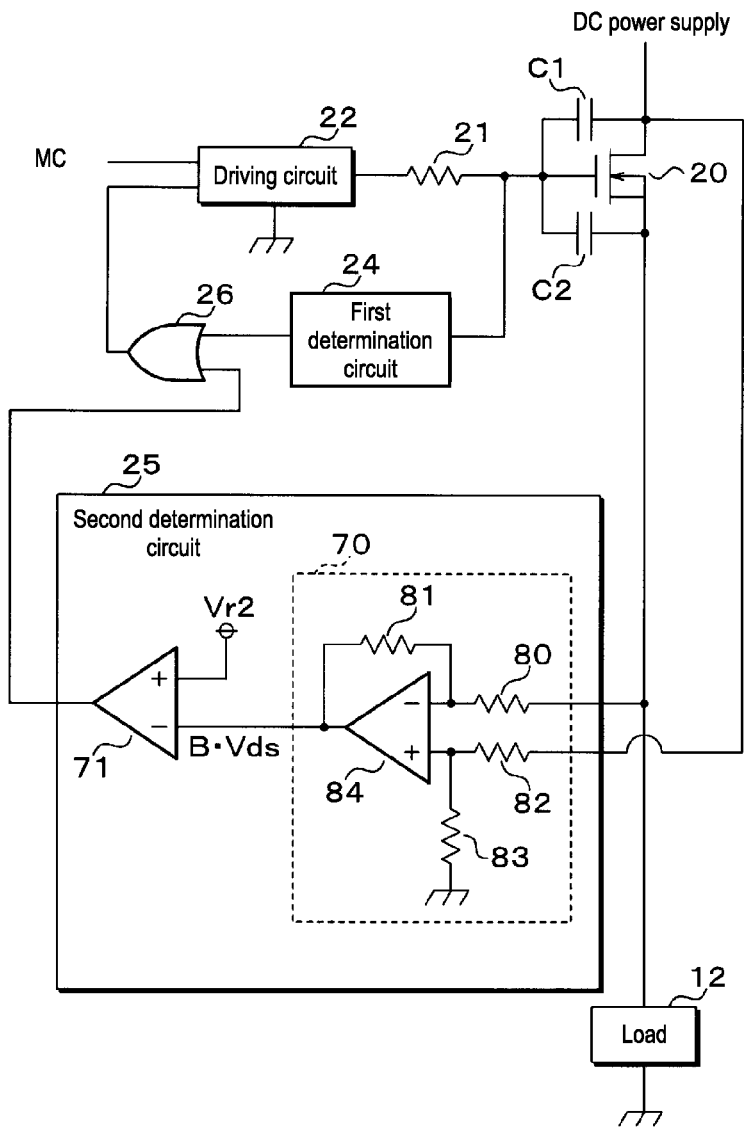
FIG. 7 is a circuit diagram of a second determination circuit according to Embodiment 2.

FIG. 7 is a circuit diagram of a second determination circuit 25 according to Embodiment 2. A power feeding control apparatus 10 according to Embodiment 2 differs from the power feeding control apparatus 10 according to Embodiment 1 in that the second determination circuit 25 has a different configuration. The second determination circuit 25 includes a second differential amplifier 70 and a third comparator 71. The second differential amplifier 70 includes second circuit resistors 80, 81, 82, and 83, and a third operational amplifier 84. Each of the third comparator 71 and the third operational amplifier 84 has a positive terminal, a negative terminal, and an output terminal.

The second determination circuit 25 according to Embodiment 2 has the same configuration as that of the first determination circuit 24. The second circuit resistors 80, 81, 82, and 83, and the third operational amplifier 84 correspond to the circuit resistors 40, 41, 42, and 43, and the first operational amplifier 44, respectively. The negative terminal of the third operational amplifier 84 is connected to the source of the FET 20 via the second circuit resistor 80. The positive terminal of the third operational amplifier 84 is connected to the drain of the FET 20 via the second circuit resistor 82. The output terminal of the third comparator 71 is connected to the second input terminal of the OR circuit 26. The second reference voltage Vr2 is applied to the positive terminal of the third comparator 71.

The resistance values of the second circuit resistors 80 and 82 match each other. The resistance values of the second circuit resistors 81 and 83 match each other. Accordingly, the third operational amplifier 84 amplifies the voltage between the drain and the source of the FET 20, or in other words, the drain-source voltage Vds. The third operational amplifier 84 applies the amplified voltage to the negative terminal of the third comparator 71. The expressions "the resistance values of the second circuit resistors 80 and 82 match each other" and "the resistance values of the second circuit resistors 81 and 83 match each other" do not only refer to cases where they match each other in a strict sense. There is no problem as long as they substantially match each other.

In FIG. 7, B indicates the amplification factor of the second differential amplifier 70. The output voltage of the third operational amplifier 84 is expressed by B·Vds. The amplification factor B is expressed by (resistance value of second circuit resistor 81/(resistance value of second circuit resistor 80), and is greater than 0. The resistance values of the second circuit resistors 80, 81, 82, and 83 are fixed values, and thus the fixed value of the amplification factor B. The amplification factor B is 1 when the resistance values of the second circuit resistors 80, 81, 82, and 83 match each other.

The third comparator 71 outputs a voltage to the OR circuit 26. The output voltage of the third comparator 71 is the output voltage of the second determination circuit 25. The third comparator 71 compares the output voltage of the third operational amplifier 84 with the second reference voltage Vr2. The third comparator 71 functions as a third comparison device. The second reference voltage Vr2 of Embodiment 2 corresponds to the third predetermined voltage. The third comparator 71 switches the output voltage to a high-level voltage or a low-level voltage according to the result of the comparison.

The third comparator 71 switches the output voltage to a low-level voltage when Equation (15) given below is satisfied.

$$B \cdot Vds \geq Vr2 \quad (15)$$

Equation (16) given below is obtained by expanding Equation (15).

$$Vds \geq Vr2/B \quad (16)$$

In Embodiment 2, the second reference voltage Vr2 is set to B·Vth2. Accordingly, the third comparator 71 switches the output voltage to a low-level voltage when Equation (17) given below is satisfied.

$$Vds \geq Vth2 \quad (17)$$

Likewise, when Equation (18) given below is satisfied, the third comparator 71 switches the output voltage to a high-level voltage.

$$B \cdot Vds < Vr2 \quad (18)$$

As noted above, Vr2 is set to B·Vth2, and thus when Equation (19) given below is satisfied, the third comparator 71 switches the output voltage to a high-level voltage.

$$Vds < Vth2 \quad (19)$$

As described above, the second reference voltage Vr2 is set to B·Vth2, and thus a comparison between the drain-source voltage Vds and the second threshold value Vth2 is achieved. The third comparator 71 outputs a low-level voltage when the drain-source voltage Vds is greater than or equal to the second threshold value Vth2, and outputs a high-level voltage when the drain-source voltage Vds is less than the second threshold value Vth2.

The power feeding control apparatus 10 according to Embodiment 2 produces the same advantageous effects as those of the power feeding control apparatus 10 according to Embodiment 1.

Variation of Embodiments 1 and 2

In Embodiments 1 and 2, there is no problem as long as the FET 20 functions as a semiconductor switch. Accordingly, it is also possible to use, instead of the FET 20, a semiconductor switch that is different from an N-channel type FET such as, for example, an IGBT (Insulated Gate Bipolar Transistor). In this case, the collector and the emitter of the IGBT correspond to the drain and the source of the FET 20, respectively. Also, in Embodiments 1 and 2, there is no problem as long as the first determination circuit 24 is a circuit that outputs a voltage that corresponds to the result of comparison between the control voltage Vgs and the first threshold value Vth1. Accordingly, the configuration of the first determination circuit 24 is not limited to the configuration in which the first determination circuit 24 includes a first differential amplifier 30 and a first comparator 31.

Embodiments 1 and 2 disclosed herein are exemplary in all aspects, and thus are not to be construed as limiting. The scope of the disclosure of the present application is indicated by the appended claims rather than the foregoing description, and all changes that come within the meaning and range of equivalency of the claims are intended to be embraced within the scope of the disclosure of the present application.

The invention claimed is:

1. A power feeding control apparatus comprising:
   an N-channel type FET that is provided on an electric current path along which an electric current flows from a DC power supply to a load such that a drain of the FET is located upstream of a source of the FET;
   a first determination circuit that determines whether or not a control voltage between a gate and the source of the FET is greater than or equal to a first threshold value;
   a second determination circuit that determines whether or not a drain-source voltage between the drain and the source of the FET is greater than or equal to a second threshold value; and
   a switching circuit that switches the FET off when the first determination circuit determines that the control voltage is greater than or equal to the first threshold value, and the second determination circuit determines that the drain-source voltage is greater than or equal to the second threshold value.

2. The power feeding control apparatus according to claim 1,
   wherein, when the control voltage is increased,
   the first threshold value is greater than the control voltage at a time at which the electric current starts flowing via the drain and the source of the FET, and
   the second threshold value is greater than or equal to 0 V and less than a voltage of the DC power supply.

3. The power feeding control apparatus according to claim 2, wherein the first determination circuit includes:
   an amplifier that amplifies the control voltage; and
   a comparison device that compares the control voltage amplified by the amplifier with a predetermined voltage, and
   the predetermined voltage is set to a product of the first threshold value and an amplification factor of the amplifier.

4. The power feeding control apparatus according to claim 2, wherein the second determination circuit includes:
   a first resistor that is provided on a second electric current path along which an electric current flows and whose upstream side end is connected to the drain of the FET;
   an adjustment device that adjusts a voltage of a downstream side end of the first resistor to a voltage of the source of the FET;
   a second resistor that is located downstream of the first resistor on the second electric current path; and
   a second comparison device that compares an across voltage of the second resistor with a second predetermined voltage, and
   the second predetermined voltage is set to a value obtained by dividing a product of the second threshold value and a resistance value of the second resistor by a resistance value of the first resistor.

5. The power feeding control apparatus according to claim 2, wherein the second determination circuit includes:
  a second amplifier that amplifies the drain-source voltage; and
  a third comparison device that compares the drain-source voltage amplified by the second amplifier with a third predetermined voltage, and
  the third predetermined voltage is set to a product of the second threshold value and an amplification factor of the second amplifier.

6. The power feeding control apparatus according to claim 1, wherein the first determination circuit includes:
  an amplifier that amplifies the control voltage; and
  a comparison device that compares the control voltage amplified by the amplifier with a predetermined voltage, and
  the predetermined voltage is set to a product of the first threshold value and an amplification factor of the amplifier.

7. The power feeding control apparatus according to claim 6, wherein the second determination circuit includes:
  a first resistor that is provided on a second electric current path along which an electric current flows and whose upstream side end is connected to the drain of the FET;
  an adjustment device that adjusts a voltage of a downstream side end of the first resistor to a voltage of the source of the FET;
  a second resistor that is located downstream of the first resistor on the second electric current path; and
  a second comparison device that compares an across voltage of the second resistor with a second predetermined voltage, and
  the second predetermined voltage is set to a value obtained by dividing a product of the second threshold value and a resistance value of the second resistor by a resistance value of the first resistor.

8. The power feeding control apparatus according to claim 6, wherein the second determination circuit includes:
  a second amplifier that amplifies the drain-source voltage; and
  a third comparison device that compares the drain-source voltage amplified by the second amplifier with a third predetermined voltage, and
  the third predetermined voltage is set to a product of the second threshold value and an amplification factor of the second amplifier.

9. The power feeding control apparatus according to claim 1, wherein the second determination circuit includes:
  a first resistor that is provided on a second electric current path along which an electric current flows and whose upstream side end is connected to the drain of the FET;
  an adjustment device that adjusts a voltage of a downstream side end of the first resistor to a voltage of the source of the FET;
  a second resistor that is located downstream of the first resistor on the second electric current path; and
  a second comparison device that compares an across voltage of the second resistor with a second predetermined voltage, and
  the second predetermined voltage is set to a value obtained by dividing a product of the second threshold value and a resistance value of the second resistor by a resistance value of the first resistor.

10. The power feeding control apparatus according to claim 1, wherein the second determination circuit includes:
  a second amplifier that amplifies the drain-source voltage; and
  a third comparison device that compares the drain-source voltage amplified by the second amplifier with a third predetermined voltage, and
  the third predetermined voltage is set to a product of the second threshold value and an amplification factor of the second amplifier.

\* \* \* \* \*